US011688546B2

(12) United States Patent
Lee et al.

(10) Patent No.: US 11,688,546 B2
(45) **Date of Patent: *Jun. 27, 2023**

(54) COIL COMPONENT

(71) Applicant: SAMSUNG ELECTRO-MECHANICS CO., LTD., Suwon-si (KR)

(72) Inventors: Kwi Jong Lee, Suwon-si (KR); Jung Min Kim, Suwon-si (KR); Young Seuck Yoo, Suwon-si (KR); Sung Jin Huh, Suwon-si (KR); Jin Hyuck Yang, Suwon-si (KR); Tae Hyun Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 389 days.

This patent is subject to a terminal disclaimer.

(21) Appl. No.: 16/911,128

(22) Filed: Jun. 24, 2020

(65) Prior Publication Data

US 2021/0193373 A1 Jun. 24, 2021

(30) Foreign Application Priority Data

Dec. 24, 2019 (KR) ........................ 10-2019-0173853

(51) Int. Cl.
*H01F 27/29* (2006.01)
*H01F 27/32* (2006.01)
(Continued)

(52) U.S. Cl.
CPC ....... *H01F 27/292* (2013.01); *H01F 17/0013* (2013.01); *H01F 17/04* (2013.01); *H01F 27/32* (2013.01); *H01F 2017/048* (2013.01)

(58) Field of Classification Search
CPC ........ H01F 1/20; H01F 17/04; H01F 17/0013; H01F 41/0246; H01F 41/10; H01F 2017/048; H01F 27/292; H01F 27/32
See application file for complete search history.

(56) References Cited

U.S. PATENT DOCUMENTS

2008/0036566 A1* 2/2008 Klesyk .................. H01F 27/292 29/605
2014/0009254 A1* 1/2014 Ohkubo .............. H01F 17/0033 336/192
(Continued)

FOREIGN PATENT DOCUMENTS

CN 111986896 A * 11/2020 ........... H01F 27/255
JP 6299868 B2 3/2018
(Continued)

OTHER PUBLICATIONS

Korean Office Action dated Mar. 4, 2021 issued in Korean Patent Application No. 10-2019-0173853 (with English translation).

*Primary Examiner* — Jeffrey T Carley
(74) *Attorney, Agent, or Firm* — Morgan, Lewis & Bockius LLP

(57) ABSTRACT

A coil component includes a support substrate and a coil portion disposed on the support substrate, a body in which the support substrate and the coil portion are embedded, first and second lead portions extending from the coil portion and respectively exposed to a surface of the body, a surface insulating layer disposed on the surface of the body and having openings respectively exposing the first and second lead portions, and first and second external electrodes disposed on the surface insulating layer and connected to the first and second lead portions exposed through the openings. Each of the first and second external electrodes includes a
(Continued)

first metal layer formed of a metal and in direct contact with the first and second lead portions.

14 Claims, 7 Drawing Sheets

(51) Int. Cl.
*H01F 17/04* (2006.01)
*H01F 17/00* (2006.01)

(56) References Cited

U.S. PATENT DOCUMENTS

| | | | | |
|---|---|---|---|---|
| 2015/0187487 | A1* | 7/2015 | Park | H01F 17/0013 336/192 |
| 2016/0086714 | A1 | 3/2016 | Moon et al. | |
| 2016/0217903 | A1* | 7/2016 | Jeong | H01F 17/04 |
| 2016/0225517 | A1* | 8/2016 | Choi | H01F 27/292 |
| 2016/0240296 | A1* | 8/2016 | Kim | H01F 17/04 |
| 2016/0268038 | A1* | 9/2016 | Choi | H01F 27/255 |
| 2017/0032887 | A1 | 2/2017 | Hamada et al. | |
| 2017/0162319 | A1* | 6/2017 | Otani | H01G 4/252 |
| 2018/0137965 | A1 | 5/2018 | Lee | |
| 2018/0308609 | A1* | 10/2018 | Shinohara | H01F 1/26 |
| 2020/0052673 | A1* | 2/2020 | Sasaki | H03H 7/09 |
| 2020/0365315 | A1 | 11/2020 | Kim et al. | |
| 2021/0202148 | A1* | 7/2021 | Lee | H01F 27/32 |

FOREIGN PATENT DOCUMENTS

| | | | | |
|---|---|---|---|---|
| KR | 10-2014-0005088 | A | 1/2014 | |
| KR | 10-1580411 | B1 | 12/2015 | |
| KR | 20170079079 | A * | 7/2017 | H01F 17/04 |
| KR | 10-2018-0028374 | A | 3/2018 | |
| KR | 10-2018-0054266 | A | 5/2018 | |
| KR | 10-2019-0072243 | A | 6/2019 | |
| KR | 10-2176276 | B1 | 11/2020 | |

* cited by examiner

COIL COMPONENT

CROSS-REFERENCE TO RELATED APPLICATION(S)

This application claims benefit under 35 USC 119(a) of Korean Patent Application No. 10-2019-0173853 filed on Dec. 24, 2019 in the Korean Intellectual Property Office, the entire disclosure of which is incorporated herein by reference for all purposes.

TECHNICAL FIELD

The present disclosure relates to a coil component.

BACKGROUND

Inductors, as coil components, are typical passive elements constituting electronic circuits together with resistors and capacitors to remove noise.

A thin-film coil component is manufactured by forming a coil portion by plating, and then curing a magnetic powder-resin composite in which the magnetic powder and resin are mixed to produce a body, and forming an external electrode on the outside of the body.

However, when the body is manufactured using the magnetic metal powder and the external electrode is formed by plating on the outside of the body, parasitic capacitance may occur between the coil portion and the external electrode.

Therefore, it is necessary to improve the characteristics of the component by disposing an insulating layer on the surface of the body and adjusting the distance between the coil portion and the external electrode or the contact area between the body and the external electrode.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide a coil component in which parasitic capacitance may be reduced by adjusting a distance between a coil portion and an external electrode or an area of contact between a body and an external electrode.

An aspect of the present disclosure is to provide a coil component in which the reduction in a magnetic substance volume of a body may be effectively prevented.

According to an aspect of the present disclosure, a coil component includes a support substrate and a coil portion disposed on the support substrate, a body in which the support substrate and the coil portion are embedded, first and second lead portions extending from the coil portion and respectively exposed to a surface of the body, a surface insulating layer disposed on the surface of the body and having openings respectively exposing the first and second lead portions, and first and second external electrodes disposed on the surface insulating layer and connected to the first and second lead portions exposed through the opening. Each of the first and second external electrodes includes a first metal layer formed of a metal and in direct contact with the first and second lead portions.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Figure 1:
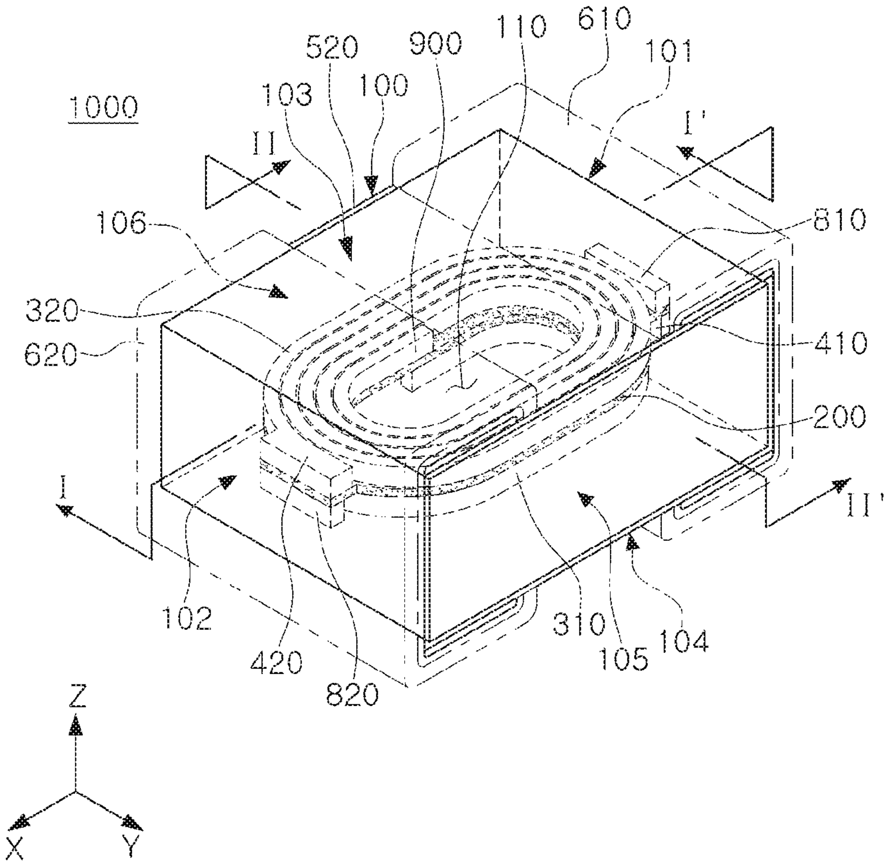
FIG. 1 schematically illustrates a coil component according to a first embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there may be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after gaining an understanding of the disclosure of this application.

The drawings may not be to scale, and the relative size, proportions, and depiction of elements in the drawings may be exaggerated for clarity, illustration, and convenience.

A value used to describe a parameter such as a 1-D dimension of an element including, but not limited to, "length," "width," "thickness," diameter," "distance," "gap," and/or "size," a 2-D dimension of an element including, but not limited to, "area" and/or "size," a 3-D dimension of an element including, but not limited to, "volume" and/or "size", and a property of an element including, not limited to, "roughness," "density," "weight," "weight ratio," and/or "molar ratio" may be obtained by the method(s) and/or the tool(s) described in the present disclosure. The present disclosure, however, is not limited thereto. Other methods and/or tools appreciated by one of ordinary skill in the art, even if not described in the present disclosure, may also be used.

In the drawings, the X direction may be defined as a first direction or a longitudinal direction, a Y direction as a second direction or a width direction, and a Z direction as a third direction or a thickness direction.

Hereinafter, a coil component according to an exemplary embodiment will be described in detail with reference to the accompanying drawings, and in describing with reference to the accompanying drawings, the same or corresponding components are assigned the same reference numbers, and overlapped descriptions thereof will be omitted.

Various types of electronic components are used in electronic devices, and various types of coil components may be appropriately used to remove noise between the electronic components.

For example, in electronic devices, coil components may be used as power inductors, high-frequency (HF) inductors, general beads, high-frequency beads (GHz Beads), and common mode filters.

Hereinafter, exemplary embodiments will be described on the premise that a coil component according to an exemplary embodiment is a power inductor used in a power line of a power supply circuit. However, the coil component according to an exemplary embodiment may be suitably applied as a chip bead, a chip filter, or the like as well as a power inductor.

First Embodiment

Figure 2:
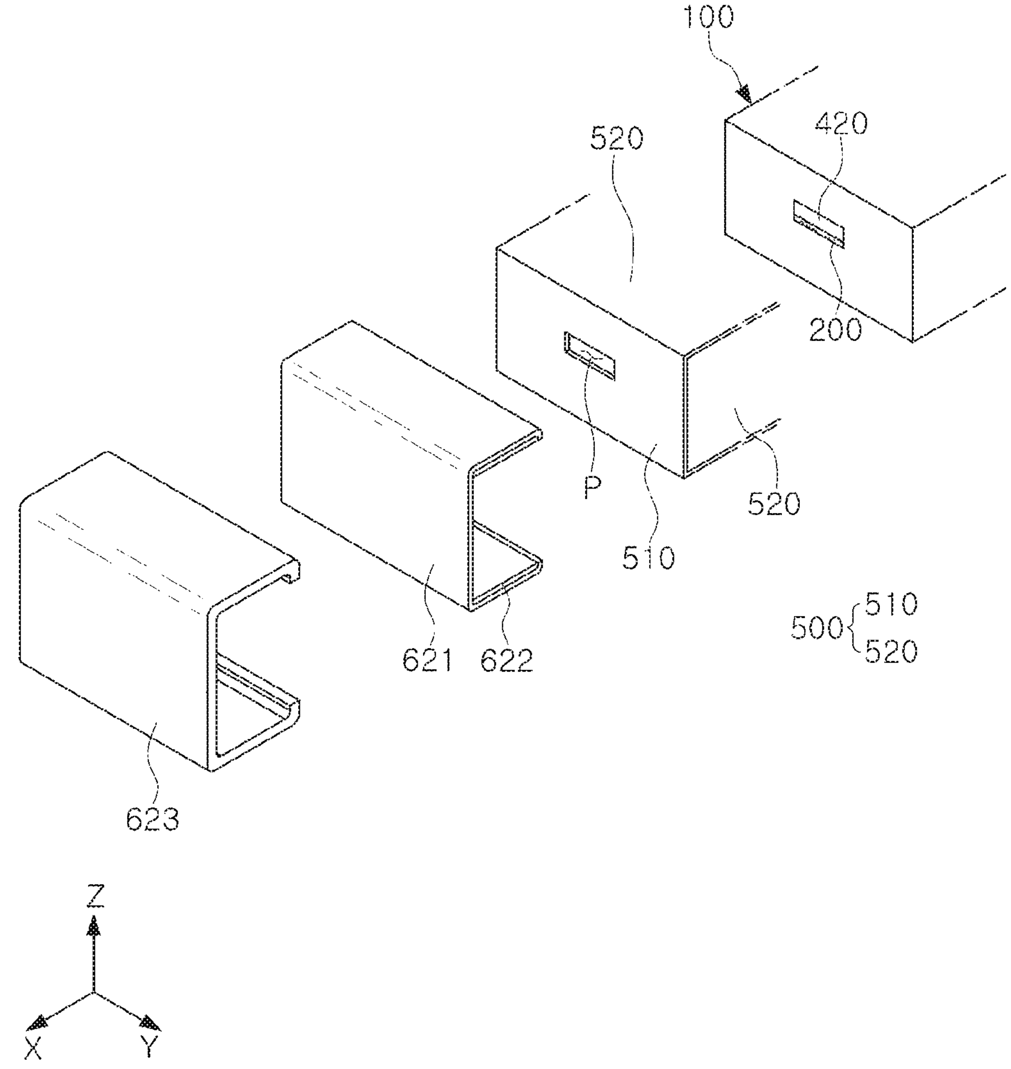
FIG. 2 schematically illustrates the arrangement structure of a surface insulating layer and an external electrode formed in the coil component of FIG. 1.
Figure 3:
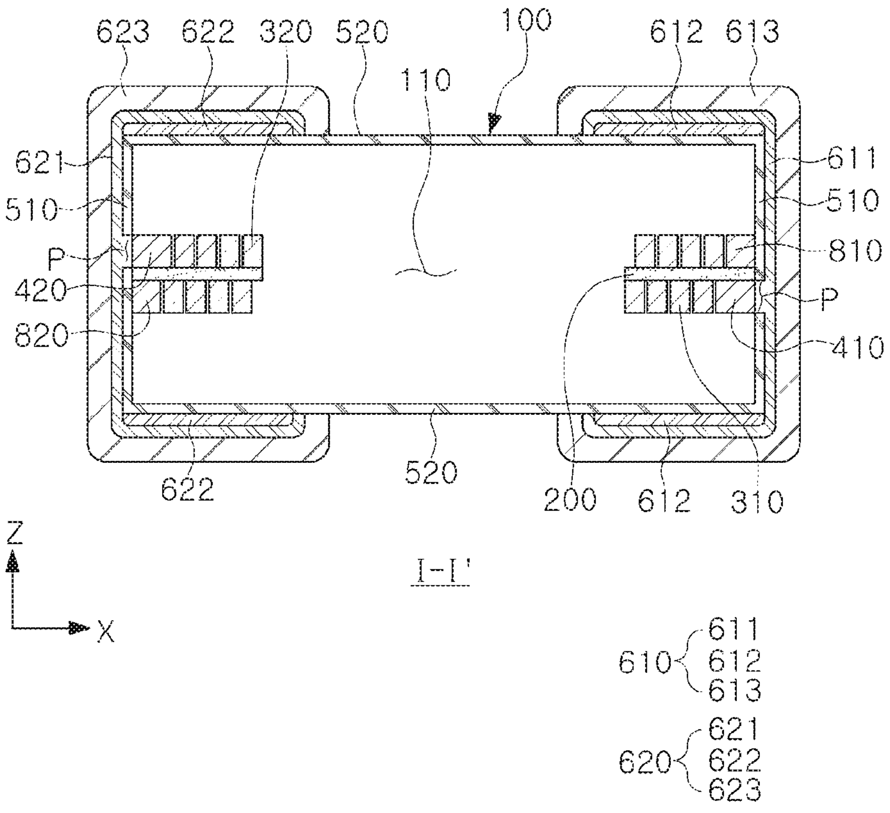
FIG. 3 is a view illustrating a cross section taken along line I-I' in FIG. 1.
Figure 4:
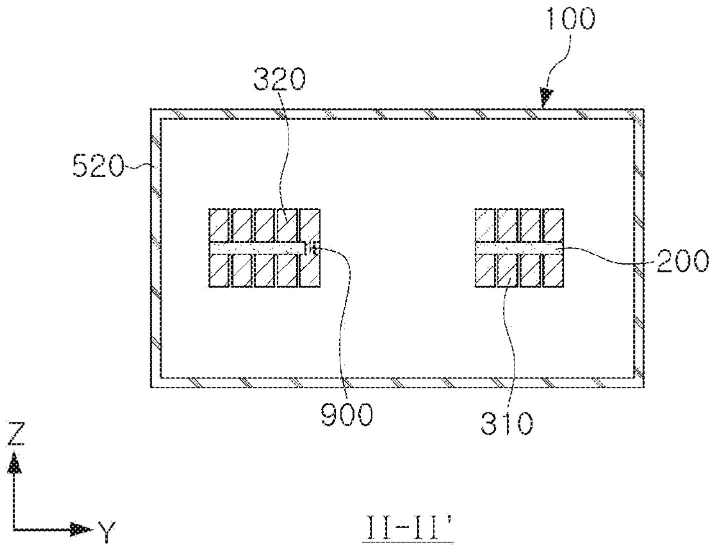
FIG. 4 is a view illustrating a cross section taken along line II-II' of FIG. 1.

FIG. 1 is a view schematically illustrating a coil component according to a first embodiment. FIG. 2 is a view schematically illustrating the arrangement structure of a surface insulating layer and an external electrode formed in the coil component of FIG. 1. FIG. 3 is a view illustrating a cross section taken along line I-I' of FIG. 1. FIG. 4 is a view illustrating a cross section taken along line II-II' of FIG. 1.

FIG. 1 mainly illustrates a body applied to a coil component according to the first embodiment, and FIG. 2 mainly illustrates a surface insulating layer and an external electrode applied to the coil component according to the first embodiment.

Referring to FIGS. 1 to 4, a coil component 1000 according to the first embodiment includes a body 100, a support substrate 200, first and second coil portions 310 and 320, and first and second lead portions 410 and 420, a surface insulating layer 500, first and second external electrodes 610 and 620, and first and second auxiliary lead portions 810 and 820.

The body 100 forms the exterior of the coil component 1000 according to the embodiment, and includes the support substrate 200 and the coil portions 310 and 320 embedded therein to be described later.

The body 100 may be formed to have a hexahedral shape as a whole.

Based on FIG. 1, the body 100 includes a first surface 101 and a second surface 102 opposing each other in the X direction, a third surface 103 and a fourth surface 104 opposing each other in the Z direction, and a fifth surface 105 and a sixth surface 106 opposing each other in the Y direction. The first surface 101 and the second surface 102 of the body 100 opposing each other respectively connect the third surface 103 and the fourth surface 104 of the body 100 opposing each other. The fifth surface 105 and the sixth surface 106 of the body 100 opposing each other respectively connect the first surface 101 and the second surface 102 of the body 100 opposing each other. In this embodiment, one surface and the other surface of the body 100 refer to the third surface 103 and the fourth surface 104, respectively, one side and the other side refer to the first surface 101 and the second surface 102, respectively, and one end and the other end refers to the fifth surface 105 and the sixth surface 106, respectively.

The body 100 may be configured, for example, in such a manner that the coil component 1000 according to this embodiment, in which the external electrodes 610 and 620 to be described later are formed, has a length of 2.0 mm, a width of 1.2 mm and a thickness of 0.8 mm or less, or a length of 1.6 mm, a width of 0.8 mm and a thickness of 0.8 mm or less, or a length of 0.2 mm, a width of 0.25 mm and a thickness of 0.4 mm, but the configuration is not limited thereto. On the other hand, since the above-described numerical values do not take into account the error in the process, it is also within the scope of the present invention to have a numerical value different from the above-mentioned value due to the process error.

The length, width, and thickness of the coil component 1000 described above may be measured by micrometer measurement, respectively. The micrometer measurement method is measured by setting the zero point with a micrometer (apparatus) which is gage R&R (Repeatability and Reproducibility), inserting the coil part 1000 between the tips of the micrometer, and turning the micrometer's measuring lever. On the other hand, in measuring the length of the coil component 1000 by using a micrometer measurement method, the length of the coil component 1000 may mean a value measured once, or may mean an arithmetic average of values measured multiple times. This may also be applied to the case of measuring the width and thickness of the coil component 1000.

Alternatively, the length, width, and thickness of the coil component 1000 described above may be measured by a cross-section analysis method, respectively. As an example, the length of the coil part 1000 by the cross-section analysis method is an optical microscope for the cross-section in the longitudinal direction (X)-thickness direction (Z) in the center of the width direction (Y) of the body 100. Or based on a picture of a scanning electron microscope (SEM, Scanning Electron Microscope), the length of the coil component 1000 may mean the maximum value of the length of a plurality of line segments parallel to the longitudinal direction (X) of the body 100 connecting the outermost boundary line of the coil part 1000 shown in the cross-sectional view. Alternatively, the length of the coil component 1000 may mean the minimum value of the length of a plurality of line segments parallel to the longitudinal direction (X) of the body 100 connecting the outermost boundary line of the coil part 1000 shown in the cross-sectional view. Alternatively, the length of the coil component 1000 may mean an arithmetic mean value of the length of a plurality of line segments parallel to the longitudinal direction (X) of the body 100 connecting the outermost boundary line of the coil part 1000 shown in the cross-sectional view. The above description can be applied to the width and thickness of the coil component 1000 in the same way.

The body 100 may include a magnetic material and a resin. In detail, the body 100 may be formed by laminating one or more magnetic sheets including a resin and a magnetic material dispersed in the resin. The body 100 may also have a structure other than the structure in which the magnetic material is dispersed in the resin. For example, the body 100 may be formed of a magnetic material such as ferrite.

The magnetic material may be ferrite or magnetic metal powder.

Ferrite powder particles may be at least one of, for example, spinel ferrites such as Mg—Zn, Mn—Zn, Mn—Mg, Cu—Zn, Mg—Mn—Sr, Ni—Zn and the like, hexagonal ferrites such as Ba—Zn, Ba—Mg, Ba—Ni, Ba—Co, Ba—Ni—Co and the like, garnet ferrites such as Y, and Li ferrites.

The magnetic metal powder particles may include at least one of iron (Fe), silicon (Si), chromium (Cr), cobalt (Co), molybdenum (Mo), aluminum (Al), niobium (Nb), copper (Cu), nickel (Ni) and alloys thereof. For example, the magnetic metal powder may be at least one or more of pure iron powder, Fe—Si alloy powder, Fe—Si—Al alloy powder, Fe—Ni alloy powder, Fe—Ni—Mo alloy powder, Fe—Ni—Mo—Cu alloy powder, Fe—Co alloy powder, Fe—Ni—Co alloy powder, Fe—Cr alloy powder, Fe—Cr—Si alloy powder, Fe—Si—Cu—Nb alloy powder, Fe—Ni—Cr alloy powder and Fe—Cr—Al alloy powder.

The magnetic metal powder may be amorphous or crystalline. For example, the magnetic metal powder may be Fe—Si—B—Cr-based amorphous alloy powder, but is not limited thereto.

The ferrite power and the magnetic metal powder may have an average diameter of about 0.1 μm to 30 μm, respectively, but the diameters thereof are not limited thereto.

The body 100 may include two or more types of magnetic materials dispersed in a resin. In this case, the fact that the magnetic materials are different types means that the magnetic materials dispersed in the resin are distinguished from each other by any one of an average diameter, a composition, crystallinity, and a shape.

The resin may include an epoxy, polyimide, a liquid crystal polymer, or the like, alone or in combination, but the embodiment is not limited thereto.

The body 100 includes a core 110 penetrating through the first and second coil portions 310 and 320 and the support substrate 200 to be described later. The core 110 may be formed by filling through-holes of the first and second coil portions 310 and 320 with the magnetic composite sheet, but the embodiment is not limited thereto.

The support substrate 200 is embedded inside the body 100, and includes one surface and the other surface opposing each other. In this embodiment, one surface of the support substrate 200 refers to a lower surface of the support substrate 200, and the other surface of the support substrate 200 refers to an upper surface of the support substrate 200.

The thickness of the support substrate 200 may be 10 μm or more and 60 μm or less.

The support substrate 200 is formed of an insulating material including a thermosetting insulating resin such as an epoxy resin, a thermoplastic insulating resin such as polyimide, or a photoimageable dielectric resin, or may be formed of an insulating material in which a reinforcing material such as glass fiber or filler is impregnated in such an insulating resin. As an example, the support substrate 200 may be formed of an insulating material such as prepreg, Ajinomoto Build-up Film (ABF), FR-4, bismaleimide triazine (BT) film, or Photoimageable Dielectric (PID) film, but the present disclosure is not limited thereto.

As the filler, at least one or more selected from the group consisting of silica ($SiO_2$), alumina ($Al_2O_3$), silicon carbide (SiC), barium sulfate ($BaSO_4$), talc, mud, mica powder, aluminum hydroxide ($Al(OH)_3$), magnesium hydroxide ($Mg(OH)_2$), calcium carbonate ($CaCO_3$), magnesium carbonate ($MgCO_3$), magnesium oxide (MgO), boron nitride (BN), aluminum borate ($AlBO_3$), barium titanate ($BaTiO_3$) and calcium zirconate ($CaZrO_3$).

When the support substrate 200 is formed of an insulating material including a reinforcing material, the support substrate 200 may provide relatively superior rigidity. When the support substrate 200 is formed of an insulating material that does not contain glass fiber, the support substrate 200 is advantageous in terms of reducing the overall thickness of the coil portions 310 and 320. When the support substrate 200 is formed of an insulating material including a photo-imageable dielectric resin, the number of processes of forming the coil portions 310 and 320 may be reduced, which is advantageous in reducing production costs and in forming a fine via.

The first and second coil portions 310 and 320 are disposed on one surface and the other surface opposing each other, respectively, on the support substrate 200 and exhibit characteristics of the coil component. For example, when the coil component 1000 of this embodiment is used as a power inductor, the electric field of the coil portions 310 and 320 may be stored as a magnetic field to maintain an output voltage, thereby stabilizing power of electronic devices.

Referring to FIGS. 1 to 4, each of the first coil portion 310 and the second coil portion 320 may be in the form of a flat spiral formed with at least one turn with respect to the core 110 as an axis. For example, the first coil portion 310 may form at least one turn about the core 110 as an axis, on one surface of the support substrate 200.

The first and second coil portions 310 and 320 may include a coil pattern of a flat spiral shape, and the first and second coil portions 310 and 320 disposed on both surfaces of the support substrate 200 opposing each other may be electrically connected through a via electrode 900 formed in the support substrate 200.

The first and second coil portions 310 and 320 and the via electrode 900 may be formed to include a metal having excellent electrical conductivity, and for example, may be formed of silver (Ag), palladium (Pd), aluminum (Al), nickel (Ni), titanium (Ti), gold (Au), copper (Cu), platinum (Pt), or alloys thereof.

The first and second lead portions 410 and 420 extend from the first and second coil portions 310 and 320 and are exposed to the first surface 101 and the second surface 102 of the body 100, respectively. Referring to FIGS. 1 to 3, one end of the first coil portion 310 is extended on one surface of the support substrate 200 to form the first lead portion 410, and the first lead portion 410 is exposed to the first surface 101 of the body 100. In addition, one end of the second coil portion 320 is extended on the other surface of the support substrate 200 to form the second lead portion 420, and the second lead portion 420 is exposed to the second surface 102 of the body 100.

The first and second auxiliary lead portions 810 and 820 may be disposed to correspond to the first and second lead portions 410 and 420, on the other surface and one surface of the support substrate 200, respectively. The first lead portion 410 is disposed on one surface of the support substrate 200, and the first auxiliary lead portion 810 is disposed on the other surface of the support substrate 200. The second lead portion 420 is disposed on the other surface of the support substrate 200, and the second auxiliary lead portion 820 is disposed on one surface of the support substrate 200. Although not illustrated in detail, a connection via (not illustrated) connecting the first lead portion 410 and the first auxiliary lead portion 810, and a connecting via (not illustrated) connecting the second lead portion 420 and the second auxiliary lead portion 820 may be formed respectively. As a result, the first lead portion 410 and the first auxiliary lead portion 810 may be electrically connected to each other, and the second lead portion 420 and the second auxiliary lead portion 820 may be electrically connected to each other.

The first auxiliary lead portion 810 is disposed to correspond to the first lead portion 410 based on the support substrate 200, and the second auxiliary lead portion 820 is disposed to correspond to the second lead portion 420, based on the support substrate 200. On the other hand, the first and second auxiliary lead portions 810 and 820 may be exposed to the surface of the body 100 together with the first and second lead portions 410 and 420. Accordingly, the first and second external electrodes 610 and 620 are formed not only on the exposed surfaces of the first and second lead portions 410 and 420, but also on the exposed surfaces of the first and second auxiliary lead portions 810 and 820. Although not illustrated in detail, since the bonding force between the surface insulating layer 500 and the metal is weaker than the bonding force between the surface insulating layer 500 and the body 100, the opening P, which will be described later, may also be formed on the exposed surfaces of the first and second auxiliary lead portions 810 and 820. Therefore, of the surface of the body 100, the area of a region thereof in which the first and second external electrodes 610 and 620 may be metal-bonded increases, thereby increasing the bonding force between the body 100 and the first and second external electrodes 610 and 620.

At least one of the coil portions 310 and 320, the via electrode 900, the lead portions 410 and 420, and the auxiliary lead portions 810 and 820 may include at least one or more conductive layers.

For example, when the first coil portion 310, the first lead portion 410, the first auxiliary lead portion 810 and the via electrode 900 are formed by plating on one surface side of the support substrate 200, the first coil portion 310, the first lead portion 410, the first auxiliary lead portion 810, and the via electrode 900 may each include a seed layer such as an electroless plating layer or the like, and an electroplating layer. In this case, the electroplating layer may have a single layer structure or a multilayer structure. The multilayer electroplating layer may be formed of a conformal film structure in which one electroplating layer is covered by the other electroplating layer, or may be formed to have a shape in which the other electroplating layer is laminated only on one surface of one electroplating layer. In the above-described example, the seed layer of the first coil portion 310, the seed layer of the first lead portion 410, the seed layer of the first auxiliary lead portion 810 and the seed layer of the via electrode 900 may be integrally formed, so that a boundary therebetween is not formed, but the embodiment is not limited thereto. In addition, in the above-described example, the electroplating layer of the first coil portion 310, the electroplating layer of the first lead portion 410, the electroplating layer of the first auxiliary lead portion 810 and the electroplating layer of the via electrode 900 may be integrally formed, so that a boundary therebetween is not formed, but the embodiment is not limited thereto.

The coil portions 310 and 320, the lead portions 410 and 420, the auxiliary lead portions 810 and 820, and the via electrode 900, respectively, may be formed of a conductive material such as copper (Cu), aluminum (Al), silver (Ag), tin (Sn), gold (Au), nickel (Ni), lead (Pb), titanium (Ti), or alloys thereof, but the embodiment is not limited thereto.

The surface insulating layer 500 is disposed on the surface of the body 100 and has an opening P exposing the first and second lead portions 410 and 420. The opening P refers to a region in the first and second surfaces 101 and 102 of the body 100, in which the first and second lead portions 410 and 420 are exposed.

Referring to FIGS. 1 to 3, the surface insulating layer 500 includes a first surface insulating layer 510 formed on a region of the body 100 except for regions in which the first and second lead portions 410 and 420 are exposed among the first and second surfaces 101 and 102 of the body 100, and a second surface insulating layer 520 disposed on the third surface 103 and the fourth surface 104, and the fifth surface 105 and the sixth surface 106, of the body 100.

Referring to FIG. 3, the second surface insulating layer 520 is formed to reach both ends of the body 100, opposing each other in the longitudinal direction X, respectively from the third surface 103, the fourth surface 104, the fifth surface 105, and the sixth surface 106 of the body 100.

The surface insulating layer 500 may be formed of an insulating material. As an example, the insulating material may be a thermosetting resin such as an epoxy resin, a thermoplastic resin such as polyimide, a photoimageable resin, or a liquid crystal crystalline polymer (LCP), but the material is not limited thereto. For example, the surface insulating layer 500 may be formed as a plating resist for the plating of the first and second external electrodes 610 and 620 to be described later. In addition, the surface insulating layer 500 may be formed by applying or printing such an insulating material on the surface of the body 100. Therefore, the surface insulating layer 500 may be formed in a region of the surface of the body 100 except for regions in which the first and second lead portions 410 and 420 are exposed. On the other hand, the surface insulating layer 500 may be formed of a thin parylene film, or may be formed using various insulating materials such as a silicon oxide film ($SiO_2$), a silicon nitride film ($Si_3N_4$), and a silicon oxynitride film (SiON). When the insulating layer 500 is formed using these materials, various methods such as vapor deposition or the like may be used. Thus, the surface insulating layer 500 may be disposed to continuously cover the magnetic metal powder particles and the resin of the body 100, on the surface of the body 100.

Recently, as the mobile communication speed has increased, the driving frequency of coil components used in mobile devices has also tended to increase. To smoothly use the coil component in the high frequency region, there is a need to reduce the parasitic capacitance in the coil component. On the other hand, the shorter the separation distance between the coil portions 310 and 320 and the external electrodes 610 and 620 is, the larger the contact area between the body 100 and the external electrodes 610 and 620 is, the parasitic capacitance in the coil component increases. In this embodiment, by forming the surface insulating layer 500 on the surface of the body 100, the separation distance between the coil portions 310 and 320 and the external electrodes 610 and 620 is increased to significantly reduce parasitic capacitance occurring between the coil portions 310 and 320 and the external electrodes 610 and 620.

The first and second external electrodes 610 and 620 are disposed on the surface of the body 100 to cover the first and second lead portions 410 and 420. For example, the first and second external electrodes 610 and 620 are disposed on the surface insulating layer 500 and are connected to the first and second lead portions 410 and 420 exposed through the opening P, respectively.

Referring to FIGS. 1 to 3, since the first lead portion 410 is exposed to the first surface 101 of the body 100, the first external electrode 610 may be formed on the first surface 101 of the body 100 to contact the first lead portion 410. Since the second lead portion 420 is exposed to the second surface 102 of the body 100, the second external electrode 620 may be formed on the second surface 102 of the body 100 to contact the second lead portion 420. Although not illustrated in detail, the width of each of the first and second external electrodes 610 and 620 may be less than the width of the body 100. As described above, the parasitic capacitance in the coil component 1000 increases as the area of contact between the body 100 and the external electrodes 610 and 620 increases. In this embodiment, by reducing the contact area between the body 100 and the external electrodes 610 and 620 on the first and second surfaces 101 and 102, the parasitic capacitance occurring between the body 100 and the external electrodes 610 and 620 may be significantly reduced.

Referring to FIG. 3, the first and second external electrodes 610 and 620 include first metal layers 611 and 621 directly contacting the first and second lead portions 410 and 420 and filling the opening P, respectively. Since the first metal layers 611 and 621 are formed by plating directly on the surface insulating layer 500, the first metal layers 611 and 621 are formed of a metal. The first metal layers 611 and 621 may be copper (Cu) metal layers having excellent electrical conductivity and low material costs, but the embodiment is not limited thereto. On the other hand, the first metal layers 611 and 621 are formed by plating, and thus, may not contain a glass component or a resin. In the case in which the body 100 is generally manufactured by curing the magnetic metal powder-resin composite, the external electrodes 610 and 620 may be formed using a conductive resin paste containing a conductive metal and a resin. In this case, as the conductive metal contained in the conductive resin paste, silver (Ag) having a low specific resistance is mainly used, but silver (Ag) has a high material cost as well as frequent contact failures with the coil portions 310 and 320, and thus, excessive contact resistance may rise. Therefore, in the case of this embodiment of the present disclosure, since the first metal layers 611 and 621 are directly formed on the surface insulating layer 500, contact failure between the coil portions 310 and 320 and the external electrodes 610 and 620 may be prevented. In addition, in the case in which the external electrodes 610 and 620 are formed using the conductive resin paste, adjusting the coating thickness of the conductive resin paste is difficult, and thus, the external electrodes 610 and 620 may be formed thick, causing a problem such as reduction in the volume of the body 100 thereby. However, in this embodiment of the present disclosure, since the external electrodes 610 and 620 are formed by plating a metal on the surface of the body 100, the thickness of the external electrodes 610 and 620 may be adjusted to be relatively thinner. Accordingly, the volume of the body 100 may be increased, and inductance characteristics of the entirety of the component may be improved.

Referring to FIG. 3, the first and second external electrodes 610 and 620 further include first and second conductive resin layers 612 and 622 disposed on the third surface 103 or the fourth surface 104 of the body 100 and formed between the second surface insulating layer 520 and the first metal layers 611 and 621, respectively. The first and second conductive resin layers 612 and 622 may include any one or more conductive metals selected from the group consisting of copper (Cu), nickel (Ni), and silver (Ag), and a thermosetting resin. The first and second conductive resin layers 612 and 622 are formed by applying and curing a conductive paste containing a conductive metal such as silver (Ag) and a resin. Referring to FIG. 3, the first and second conductive resin layers 612 and 622 are disposed on the third surface 103 or the fourth surface 104 of the body 100 to be disposed between the second surface insulating layer 520 and the first metal layers 611 and 621. Although not illustrated in detail, by forming the above-described surface insulating layer 500 on the third surface 103 or the fourth surface 104 of the body 100 with a plating resist, the first metal layers 611 and 621 may cover only portions of the first and second conductive resin layers 612 and 622. By using the thermosetting resin included in the first and second conductive resin layers 612 and 622 and the body 100 with the same thermosetting resin, for example, an epoxy resin, bonding strength between the body 100 and the external electrodes 610 and 620 may be improved. Among the first surface 101, the third surface 103, and the fourth surface 104, the first conductive resin layer 612 is disposed only on the third surface 103, or the fourth surface 104, or both the third and fourth surfaces 103 and 104. Among the second surface 101, the third surface 103, and the fourth surface 104, the second conductive resin layer 622 is disposed only on the third surface 103, or the fourth surface 104, or both the third and fourth surfaces 103 and 104.

The first and second external electrodes 610 and 620 further include second metal layers 613 and 623 disposed on the first metal layers 611 and 621 and formed of a different metal from that of the first metal layers 611 and 621. The second metal layers 613 and 623 may include sequentially a first layer (not illustrated) containing nickel (Ni) or a second layer (not illustrated) including tin (Sn). The second layer (not illustrated), which is an outermost layer of the first and second external electrodes 610 and 620, is formed of a tin (Sn) plating layer, thereby improving bonding force with solder when mounting the coil component 1000 on a printed circuit board. In addition, by forming the first layer (not illustrated) as a nickel (Ni) plating layer, the connectivity between the first metal layers 611 and 621 formed of a copper (Cu) plating layer and the second layer (not illustrated) formed of a tin (Sn) plating layer may be improved.

Second Embodiment

Figure 5:
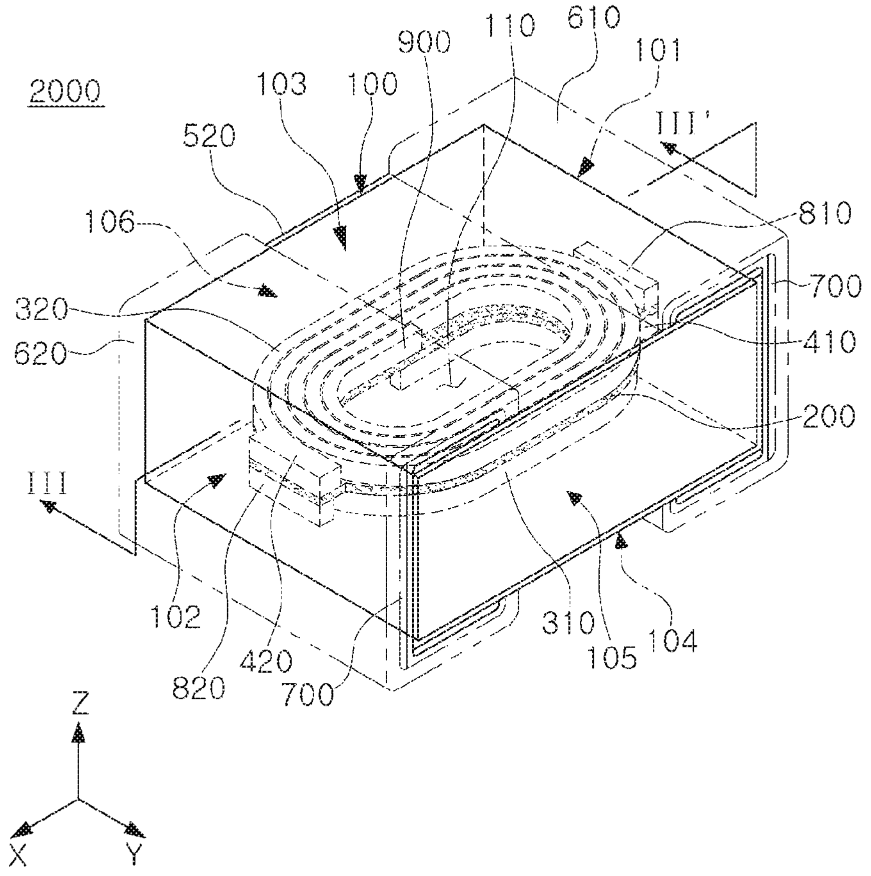
FIG. 5 is a view schematically illustrating a coil component according to a second embodiment.
Figure 6:
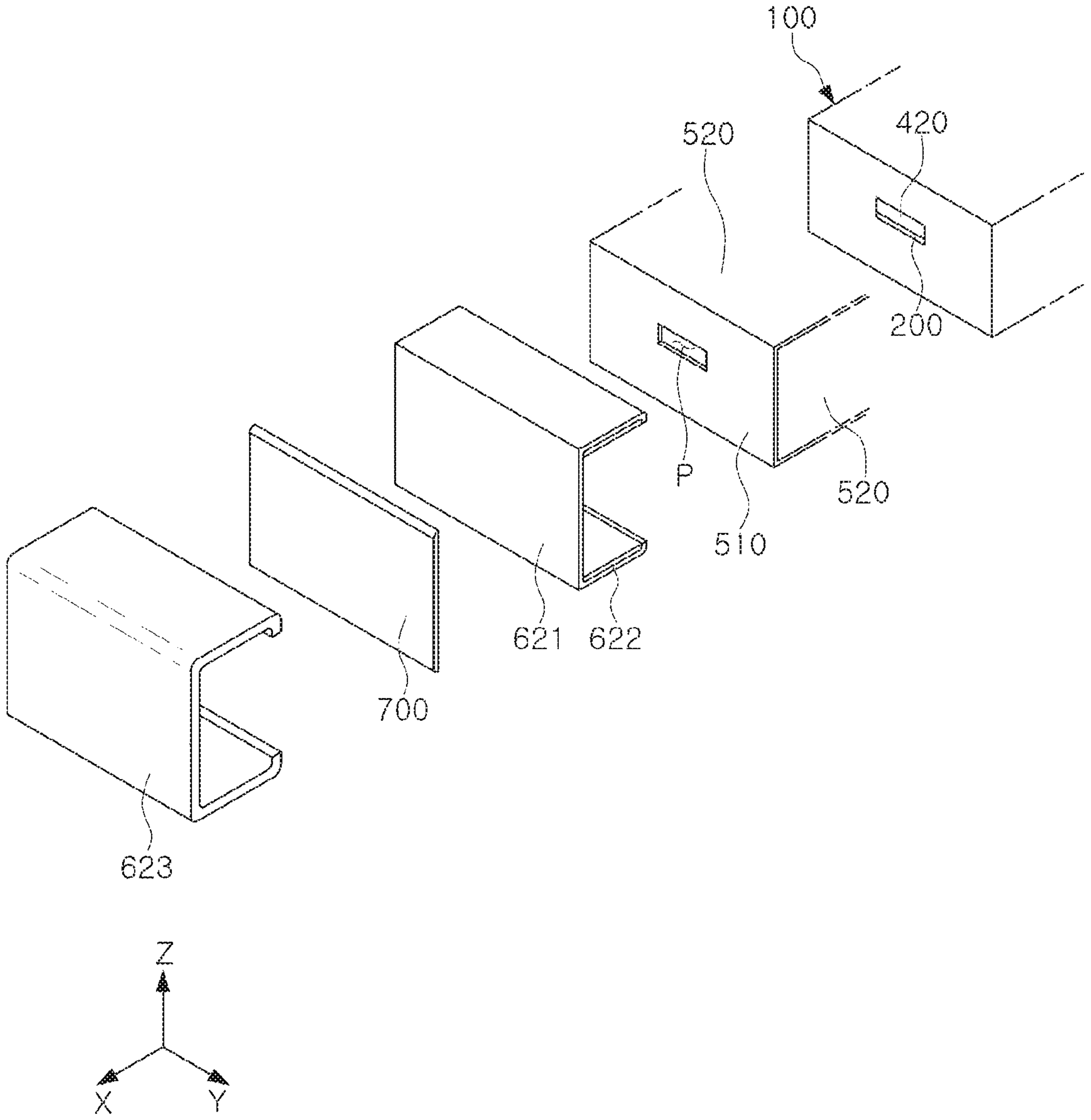
FIG. 6 is a view schematically illustrating the arrangement structure of a surface insulating layer, an external electrode, and an additional insulating layer formed in the coil component of FIG. 5.
Figure 7:
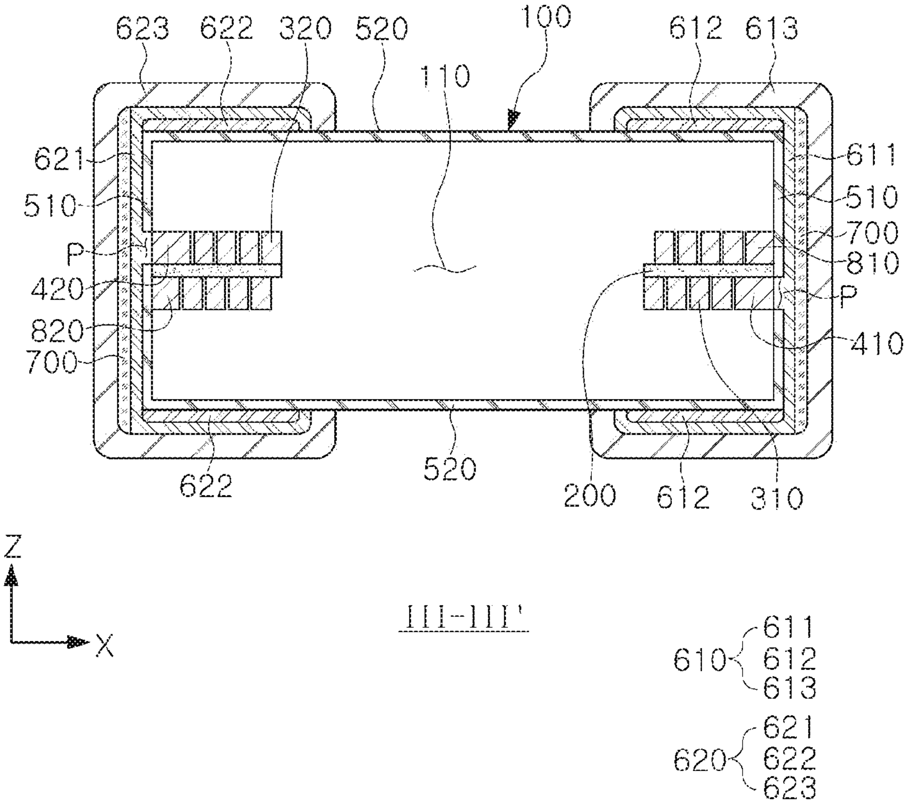
FIG. 7 is a cross section taken along line III-III' in FIG. 5.

FIG. 5 is a view schematically illustrating a coil component according to a second embodiment. FIG. 6 is a view schematically illustrating the arrangement structure of a surface insulating layer, an external electrode, and an additional insulating layer formed in the coil component of FIG. 5. FIG. 7 is a view illustrating a cross section taken along line III-III' of FIG. 5.

FIG. 5 mainly illustrates a body applied to the coil component according to the second embodiment, and FIG. 6 mainly illustrates a surface insulating layer, an external electrode, and an additional insulating layer applied to the coil component according to the second embodiment.

Compared to the coil component 1000 according to the first embodiment, the presence or absence of an additional insulating layer 700 is different in a coil component 2000 according to this embodiment. Therefore, in describing this embodiment, only the additional insulating layer 700 different from the first embodiment will be described. The rest of the configuration of this embodiment may be applied as described in the first embodiment.

Referring to FIGS. 5 and 7, the coil component 2000 of this embodiment further includes the additional insulating layer 700 disposed on the first metal layers 611 and 621. The additional insulating layer 700 is interposed between the first metal layers 611 and 621 and the second metal layers 612 and 622. The width of the additional insulating layer 700 in the Y direction may be substantially the same as the width of the body 100 in the Y direction. As described above, the parasitic capacitance in the coil component increases as the separation distance between the coil portions 310 and 320 and the external electrodes 610 and 620 is relatively shorter. In this embodiment, by further disposing the additional insulating layer 700 on the first surface 101 and the second surface 102 of the body 100, the separation distance between the coil portion 310 and 320 and the external electrodes 610 and 620 may increase, thereby significantly reducing parasitic capacitance occurring between the coil portions 310 and 320 and the external electrodes 610 and 620. To ensure a connection between the first metal layer 611 and the second metal layers 613 and a connection between the first metal layer 621 and the second metal layers 623, the additional insulating layer 700 may not be disposed on the first surface 101 and the second surface 102.

As set forth above, according to an exemplary embodiment, parasitic capacitance may be reduced by adjusting a distance between a coil portion and an external electrode or an area of contact between a body and an external electrode.

In addition, according to an exemplary embodiment, the reduction in the volume of a magnetic substance of a body may be effectively prevented.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A coil component comprising:

a support substrate;

a coil portion disposed on the support substrate;

a body in which the support substrate and the coil portion are embedded;

first and second lead portions extending from the coil portion and respectively exposed to one side surface and another side surface of the body which oppose each other, the one side surface and the another side surface being transverse to the support substrate;

a surface insulating layer disposed on the one side surface and the another side surface of the body and having openings on the one side surface and the another side surface to respectively expose the first and second lead portions; and first and second external electrodes disposed on the surface insulating layer and connected to the first and second lead portions exposed through the openings, respectively, wherein each of the first and second external electrodes includes a first metal layer comprised of a metal and being in direct contact with the first and second lead portions.

2. The coil component of claim 1, wherein the body comprises one surface and the another surface opposing each other, the one side surface and the another side surface connecting the one surface and the other another surface, and one end surface and another end surface connecting the one side and the another side and opposing each other, and the surface insulating layer comprises:

a first surface insulating layer disposed on an area of the body except for an area to which the first and second lead portions are exposed, from among the one side surface and the another side surface of the body, and a second surface insulating layer disposed on the one surface, the another surface, the one end surface and the another end surface of the body.

3. The coil component of claim 2, wherein the second surface insulating layer is disposed to reach both ends of the body, opposing each other in a longitudinal direction, respectively from on the one surface, the another surface, the one end surface and the another end surface of the body.

4. The coil component of claim 2, wherein each of the first and second external electrodes further comprises a conductive resin layer disposed on the one surface of the body and disposed between the second surface insulating layer and the first metal layer.

5. The coil component of claim 4, wherein each of the first and second external electrodes further comprises a second metal layer disposed on the first metal layer and comprised of a metal different from the metal of the first metal layer.

6. The coil component of claim 5, further comprising an additional insulating layer disposed on the first metal layer.

7. The coil component of claim 6, wherein the additional insulating layer is interposed between the first metal layer and the second metal layer.

8. The coil component of claim 6, wherein a width of the additional insulating layer is the same as a width of the body.

9. The coil component of claim 1, wherein the first metal layer is disposed in the openings.

10. The coil component of claim 1, wherein the first metal layer comprises copper (Cu).

11. The coil component of claim 1, wherein the body comprises magnetic metal powder particles and a resin, and the surface insulating layer is disposed to continuously cover the magnetic metal powder particles and the resin of the body, on the body.

12. The coil component of claim 1, wherein a width of each of the first and second external electrodes is less than a width of the body.

13. The coil component of claim 1, wherein the coil portion includes a first coil portion and a second coil portion, the support substrate has one surface and another surface opposing each other, the first and second coil portions are disposed on the one surface and the another surface of the support substrate, respectively, the first and second lead portions extend from the first and second coil portions, on the one surface and the another surface of the support substrate, respectively, and first and second auxiliary lead portions are disposed on the another surface and the one surface of the support substrate, to correspond to the first and second lead portions, respectively.

14. The coil component of claim 1, wherein the openings are spaced apart from corner edge of the one side surface and the another side surface of the body.

* * * * *